(12) United States Patent
Nguyen

(10) Patent No.: US 6,960,792 B1
(45) Date of Patent: Nov. 1, 2005

(54) BI-DIRECTIONAL SILICON CONTROLLED RECTIFIER STRUCTURE WITH HIGH HOLDING VOLTAGE FOR LATCHUP PREVENTION

(75) Inventor: Dinh Quoc Nguyen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/676,531

(22) Filed: Sep. 30, 2003

(51) Int. Cl.[7] ........................ H01L 23/62; H01L 29/74; H01L 31/111; H02H 9/00
(52) U.S. Cl. ...................... 257/173; 257/111; 257/162; 257/168; 257/355; 257/356; 257/357; 257/546
(58) Field of Search ...................... 257/546, 355–363, 257/109–111, 162, 168, 170, 173

(56) References Cited

U.S. PATENT DOCUMENTS

| | | | | |
|---|---|---|---|---|
| 4,979,001 A | * | 12/1990 | Alter ........................... | 257/337 |
| 5,903,032 A | * | 5/1999 | Duvvury ..................... | 257/356 |
| 5,959,820 A | * | 9/1999 | Ker et al. ................... | 361/111 |
| 6,236,087 B1 | * | 5/2001 | Daly et al. ................... | 257/355 |
| 6,400,542 B1 | * | 6/2002 | Lee et al. ...................... | 361/56 |
| 6,784,489 B1 | * | 8/2004 | Menegoli ..................... | 257/343 |
| 6,784,498 B1 | * | 8/2004 | Lee et al. ................... | 257/361 |
| 2002/0079530 A1 | * | 6/2002 | Wu et al. ..................... | 257/302 |
| 2003/0038298 A1 | * | 2/2003 | Cheng et al. ............... | 257/107 |
| 2003/0047786 A1 | * | 3/2003 | Lee et al. ................... | 257/355 |
| 2003/0234405 A1 | * | 12/2003 | Lai et al. ..................... | 257/107 |
| 2004/0016992 A1 | * | 1/2004 | Mallikarjunaswamy ..... | 257/546 |

OTHER PUBLICATIONS

U.S. Appl. No. 10/401,432, filed Mar. 28, 2003, Dinh Quoc Nguyen et al.

* cited by examiner

*Primary Examiner*—Tom Thomas
*Assistant Examiner*—Jesse A. Fenty
(74) *Attorney, Agent, or Firm*—Mark C. Pickering

(57) ABSTRACT

A bi-directional silicon controlled rectifier structure provides electrostatic discharge (ESD) protection against both positive and negative voltage spikes. The structure utilizes a pair of wells, n+ and p+ regions formed in both wells, a first ring formed around the junction between the first well and the semiconductor material, and a second ring formed around the junction between the second well and the semiconductor material.

19 Claims, 6 Drawing Sheets

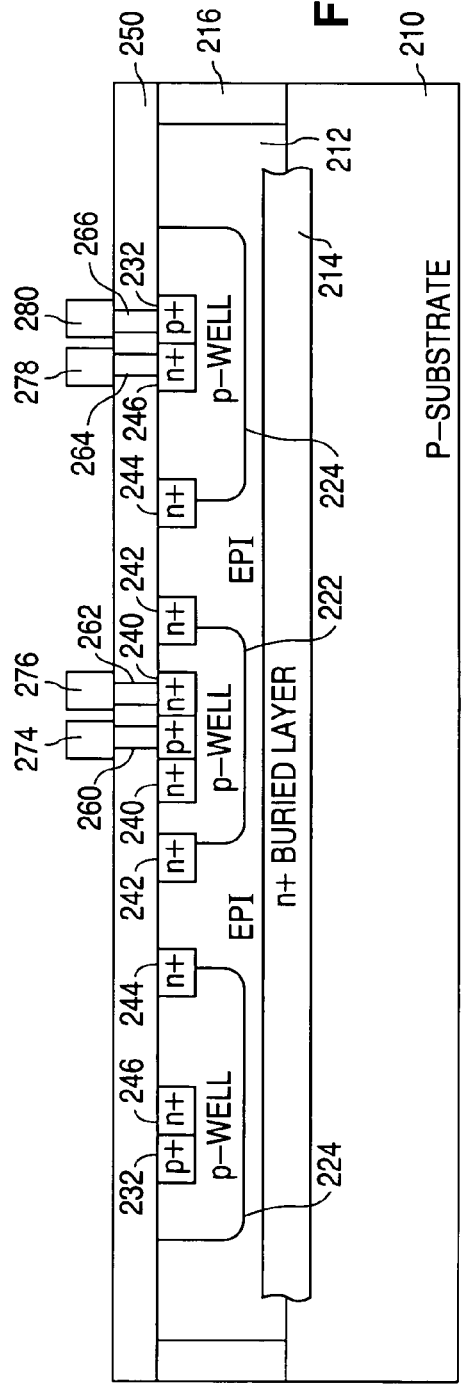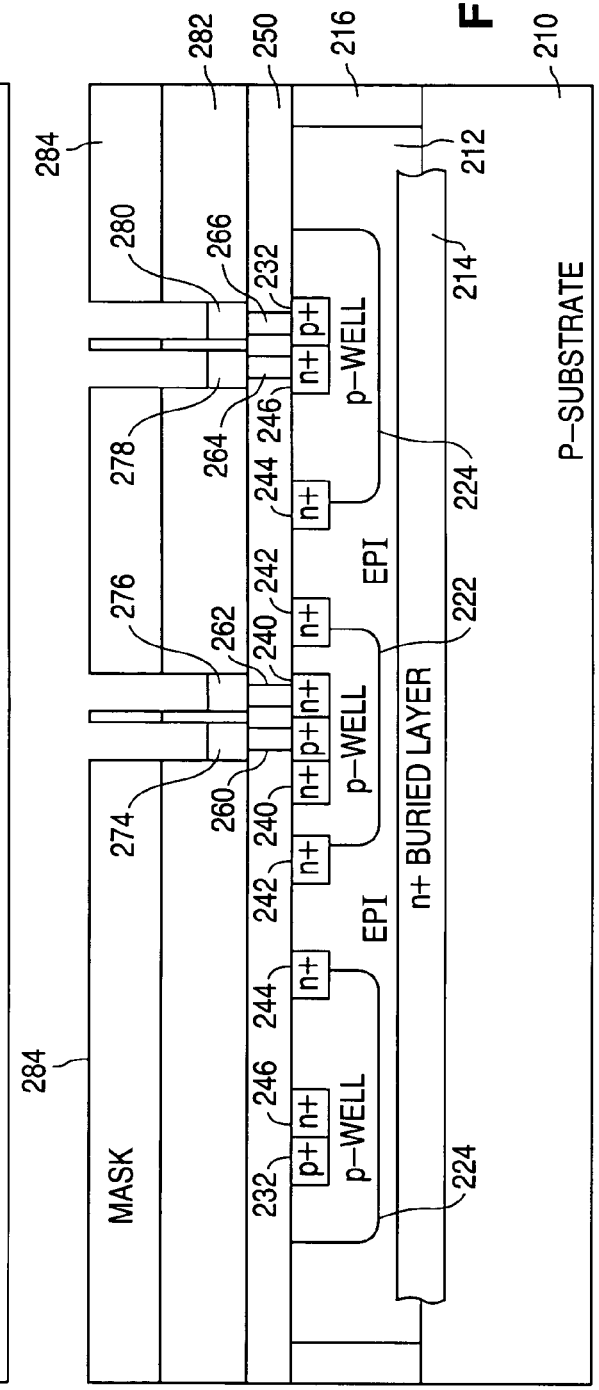

BI-DIRECTIONAL SILICON CONTROLLED RECTIFIER STRUCTURE WITH HIGH HOLDING VOLTAGE FOR LATCHUP PREVENTION

BRIEF DESCRIPTION OF THE DRAWINGS

FIG. 1A is a plan view, while FIG. 1B is a cross-sectional view taken along line 1B—1B of FIG. 1A.

FIGS. 2A–2H are a series of cross-sectional diagrams illustrating an example of a method of forming a bi-directional silicon controlled rectifier structure in accordance with the present invention.

DETAILED DESCRIPTION OF THE INVENTION

Figure 1A:
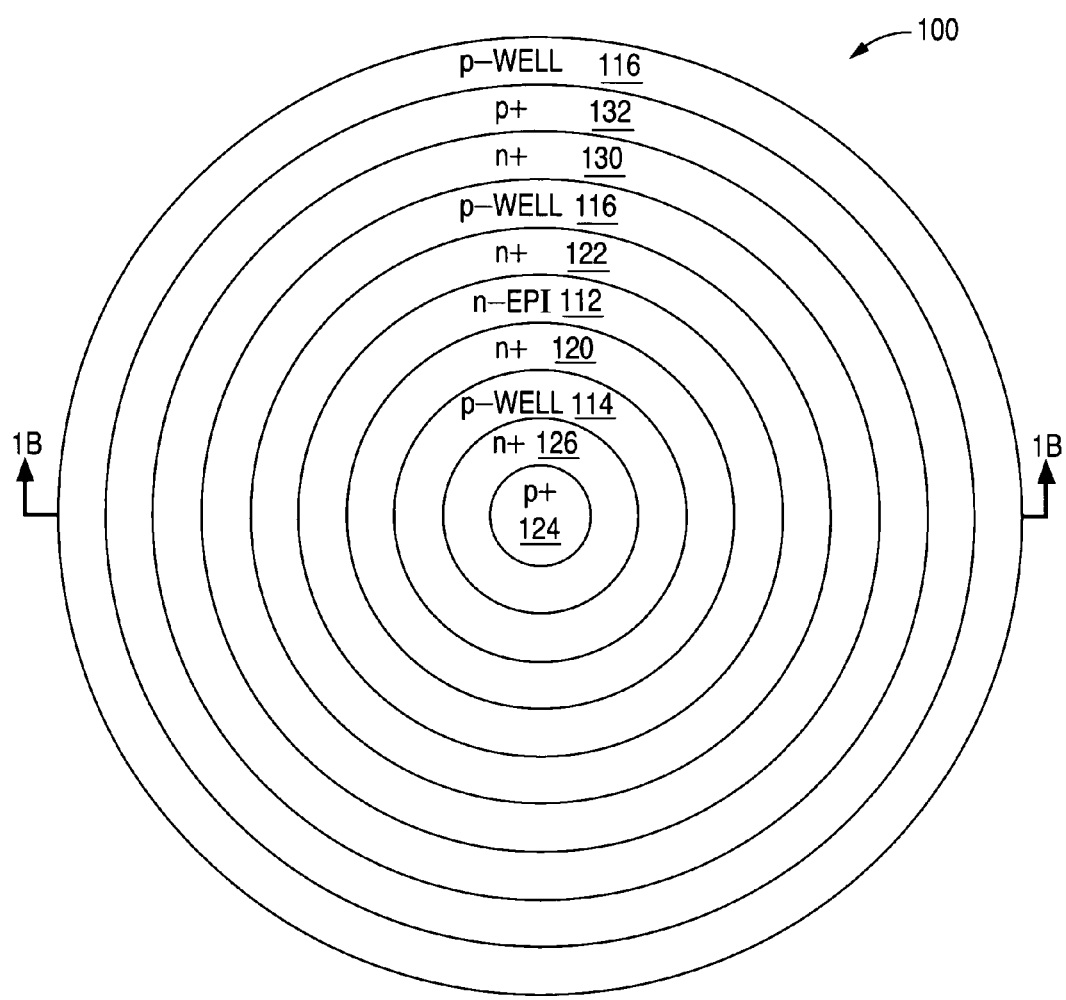
FIGS. 1A–1B are views illustrating an example of a bidirectional silicon controlled rectifier (Bi-SCR) structure 100 in accordance with the present invention.
Figure 1B:
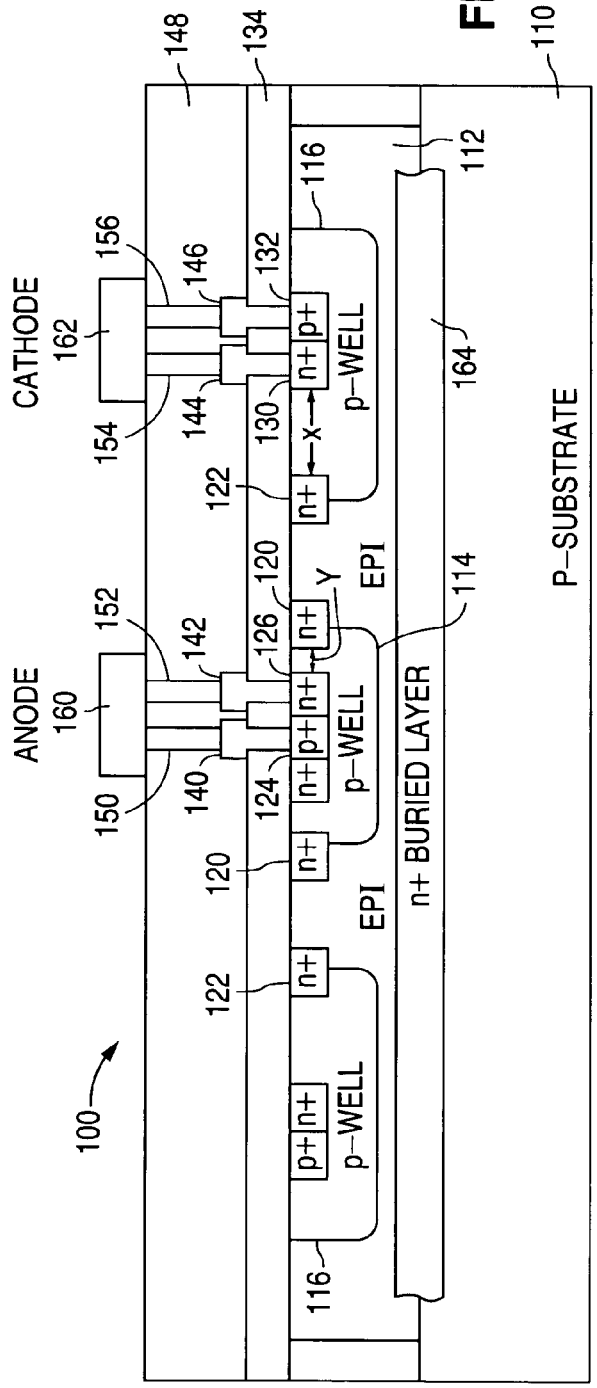

FIGS. 1A–1B show views that illustrate an example of a bi-directional silicon controlled rectifier (Bi-SCR) structure 100 in accordance with the present invention. FIG. 1A is a plan view, while FIG. 1B is a cross-sectional view taken along line 1B—1B of FIG. 1A. As described in greater detail below, Bi-SCR structure 100 provides electrostatic discharge (ESD) protection against both positive and negative voltage spikes, such as ±15 KV or greater ESD spikes, to the pads of an integrated circuit.

As shown in FIGS. 1A and 1B, Bi-SCR structure 100 includes a p-type substrate 110 and an n-type epitaxial layer 112 that is formed on substrate 110. In addition, Bi-SCR structure 100, which is circular in plan view, includes a p-type center well 114 that is formed in the top surface of epitaxial layer 112, and a p-type circular well 116 that is formed in the top surface of epitaxial layer 112 around and spaced apart from center well 114. Bi-SCR structure 100 is circular in this example to provide a large region with a more uniform current flow.

Bi-SCR structure 100 also includes an n+ inner ring 120 that is formed in the top surface of epitaxial layer 112 around center well 114 at the junction between epitaxial layer 112 and center well 114, and an n+ outer ring 122 that is formed in the top surface of epitaxial layer 112 around center well 114 at the inner junction between epitaxial layer 112 and circular well 116.

As further shown in FIG. 1, Bi-SCR structure 100 includes a p+ center region 124 that is formed in the middle of center well 114 at the top surface of epitaxial layer 112, and an n+ circular ring 126 that is formed in center well 114 around center region 124 at the top surface of epitaxial layer 112 a distance apart from n+ inner ring 120. Bi-SCR structure 100 additionally includes an n+ inside ring 130 that is formed in circular well 116 at the top surface of epitaxial layer 112.

In the present invention, a lateral distance X between n+ outer ring 122 and n+ inside ring 130, which represents the shortest distance between rings 122 and 130, controls the positive holding voltage of Bi-SCR structure 100. To obtain a positive holding voltage that is greater than, for example, 12V, the distance X is set to a value that is substantially larger than the minimum photolithographic feature size that is obtainable by the fabrication process to reduce the emitter efficiency. For example, an eight micron separation (in a 1.5-micron fabrication process) produces an SCR structure with a holding voltage greater than 12V, and a relatively low breakdown voltage of approximately 20V due to the n+ ring to p-well reversed junction.

Further, a lateral distance Y between n+ inner ring 120 and n+ circular ring 126, which represents the shortest distance between rings 120 and 126, controls the negative holding voltage of Bi-SCR structure 100. To obtain a negative holding voltage that is less than, for example, −7V, the distance Y is set to a value that is less than the distance X. For example, a 3.0 micron separation (in a 1.5-micron fabrication process) produces an SCR structure with a negative holding voltage of approximately −9V.

In addition, Bi-SCR structure 100 includes a p+ outside ring 132 that is formed in circular well 116 at the top surface of epitaxial layer 112. P+ outside ring 132 adjoins the outer edge of n+ inside ring 130, and is spaced apart from epitaxial layer 112 and n+ outer ring 122. (A layer of silicide can optionally be formed over p+ regions 124 and 132, and n+ regions 126 and 130.)

As further shown in FIG. 1B, Bi-SCR structure 100 includes a layer of isolation material 134 that is formed on epitaxial layer 112, and a first metal-1 region 140 that is formed on isolation layer 134, and through isolation layer 134 to make an electrical connection with p+ center region 124. Bi-SCR structure 100 also includes a metal-1 region 142 that is formed on isolation layer 134, and through isolation layer 134 to make an electrical connection with n+ circular ring 126.

In addition, Bi-SCR structure 100 includes a metal-1 region 144 that is formed on isolation layer 134, and through isolation layer 134 to make an electrical connection with n+ inside ring 130. Further, Bi-SCR structure 100 includes a metal-1 region 146 that is formed on isolation layer 134, and through isolation layer 134 to make an electrical connection with p+ outside ring 132.

Only one metal-1 region, region 144, is shown connected to n+ inside ring 130, and only one metal-1 region, region 146, is shown connected to p+ outside ring 132 for simplicity. Ring 130 can alternately be contacted by a number of metal-1 regions, or by a continuous ring of metal-1 to obtain a more uniform current flow.

Similarly, ring 132 can alternately be contacted by a number of metal-1 regions, or by a continuous ring of metal-1 to obtain a more uniform current flow. (Additional metal-1 regions can also be connected to ring 126.) Metal-1 regions 140, 142, 144, and 146 are spaced apart from each other.

Bi-SCR structure 100 additionally includes a layer of isolation material 148 that is formed on isolation layer 134 and metal-1 regions 140, 142, 144, and 146, a metal structure 150 that is formed through isolation layer 148 to make an electrical connection with metal-1 region 140, and a metal structure 152 that is formed through isolation layer 148 to make an electrical connection with metal-1 region 142.

Further, Bi-SCR structure 100 includes a metal structure 154 that is formed through isolation layer 148 to make an electrical connection with metal-1 region 144, and a metal structure 156 that is formed through isolation layer 148 to make an electrical connection with metal-1 region 146. (Additional metal structures are used when additional or continuous metal regions are used to contact rings 130 and 132.)

Bi-SCR structure 100 also includes a metal trace 160 that is formed on isolation layer 148 to make an electrical connection with metal structures 150 and 152, and a metal trace 162 that is formed on isolation layer 148 to make an electrical connection with metal structures 154 and 156 (and any additional structures used to make connections with rings 130 and 132 via metal-1 regions). Metal traces 160 and 162 are spaced apart.

Metal trace 160, metal structures 150 and 152, metal-1 regions 140 and 142, p+ region 124, n+ circular region 126, p-well 114, n+ inner ring 120, n+ outer ring 122, and n-type epitaxial layer 112 can function as the anode of an ESD diode structure (where the anode is connected to a to-be-protected pad).

Metal trace 162, metal structures 154 and 156, metal-1 regions 144 and 146, n+ inside ring 130, p+ outside ring 132, and p-well 116 function as the cathode of the ESD diode structure (where the cathode is connected to a ground line). In addition, Bi-SCR structure 100 can optionally include an n+ buried layer 164 that is formed in the top surface of substrate 110 and the bottom region of epitaxial layer 112.

In operation, when a voltage on the anode of Bi-SCR structure 100 rises quickly with respect to the voltage on the cathode, the voltages on p+ center region 124, n+ circular ring 126, and p-well 114 also rise quickly as large numbers of holes flow into the area. The rising voltage on p-well 114 forward biases the junction between p-well 114 and n+ inner ring 120. The forward-biased junction causes holes to be injected into n+ inner ring 120 which, in turn, causes the voltage on n+ inner ring 120 to rise and remain one diode drop below the voltage on p-well 114.

When the voltage on n+ inner ring 120 rises, the voltage on n+ outer ring 122 also rises due to the surface flow of holes from n+ inner ring 120 to n+ outer ring 122 under the influence of the anode-to-cathode electric field, reduced by the surface resistance of epitaxial layer 112 that lies between n+ inner and outer rings 120 and 122.

As the voltage on n+ outer ring 120 rises with respect to the voltage on p-well 116, the junction between p-well 116 and n+ outer ring 122 becomes reverse biased. As a result, Bi-SCR structure 100 blocks a current, other than a leakage current, from flowing from the anode to the cathode until the anode-to-cathode voltage exceeds an upper breakdown voltage.

When the rising voltage on the anode exceeds the upper breakdown voltage, avalanche multiplication causes large numbers of holes to be injected into p-well 116, and large numbers of electrons to be injected into n+ outer ring 122. The large number of holes injected into p-well 116 flow to p+ region 132, locally forward biasing the pn junction between p-well 116 and n+ inside ring 130. When forward biased, n+ inside ring 130 injects electrons into p-well 116 which flow to n+ outer region 122 to support the injection of electrons into n+ outer ring 122.

The large number of electrons in n+ outer region 122 flow to n+ inner region 120 via n-epitaxial layer 112 under the influence of the anode-to-cathode electric field. As a forward-biased junction, n+ inner ring 120 injects electrons into the highly-depleted surface region of p-well 114 which, in turn, flow to n+ circular region 126. As a result, Bi-SCR structure 100 provides both a hole flow and an electron flow.

Further, the accumulation of positive charge in p-type well 116 and the accumulation of negative charge in n+ outer ring 122 due to the injection of large numbers of holes and electrons, respectively, reduces the magnitude of the reversed biased junction until the pn junction between p-type well 116 and n+ outer ring 122 switches and becomes forward biased.

Once the pn junction between p-type well 116 and n+ outer ring 122 becomes forward biased, a large current flows from the anode to the cathode, while the anode-to-cathode voltage drops to a holding voltage that is substantially lower than the breakdown voltage. For example, the RS-485 specification requires an anode-to-cathode holding voltage of greater than 12V.

Bi-SCR structure 100 also responds to negative voltage spikes on the anode as well as positive voltages. In this case, when a voltage on the anode of Bi-SCR structure 100 falls quickly with respect to the voltage on the cathode, the voltages on p+ center 124, n+ circular ring 126, and p-well 114 also fall quickly as large numbers of electrons flow into the area.

At the same time, p-well 116 is connected to ground via p+ outside ring 132. As a result, n+ outer ring 122 can fall no lower than one diode drop below ground without forward biasing the junction. Similarly, n+ inner ring 120 can fall no lower than one diode drop below ground less the resistance associated with the intervening region of epitaxial layer 112. Thus, the falling voltage on p-well 114 reverse biases the junction between p-well 114 and n+ inner ring 120. As a result, Bi-SCR structure 100 blocks a current, other than a leakage current, from flowing from the cathode to the anode until the anode-to-cathode voltage exceeds a lower breakdown voltage.

When the falling voltage on the anode falls below the lower breakdown voltage, avalanche multiplication causes large numbers of holes to be injected into p-well 114, and large numbers of electrons to be injected into n+ inner ring 120. The large number of electrons injected into n+ inner ring 120 flow to n+ outer ring 122 under the influence of the electric field where the increase in electrons forward biases the junction. The forward-biased junction causes electrons to be injected into p-well 116, which then flow to inside ring 130, and holes to be injected into n+ outer ring 122.

The holes in n+ outer ring 122 flow to n+ inner ring 120 under the influence of the electric field which, in turn, support the injection of holes into p-well 114. The large number of holes in p-well 114 flow to p+ center region 124, locally forward biasing the junction between p-well 114 and n+ circular ring 126. As a forward-biased junction, n+ circular ring 126 injects electrons into the highly-depleted surface region of p-well 114 which, in turn, are injected into n+ inner ring 120. As a result, Bi-SCR structure 100 provides both a hole flow and an electron flow for negative spikes.

Further, the accumulation of positive charge in p-type well 114 and the accumulation of negative charge in n+ inner ring 120 due to the injection of large numbers of holes and electrons, respectively, reduces the magnitude of the reversed biased junction until the pn junction between p-type well 114 and n+ inner ring 120 switches and becomes forward biased.

Once the pn junction between p-type well 114 and n+ inner ring 120 becomes forward biased, a large current flows from the cathode to the anode, while the anode-to-cathode voltage drops to a holding voltage that is substantially lower than the breakdown voltage. For example, the RS-485 specification requires an anode-to-cathode holding voltage of −7V.

One of the advantages of the present invention is that the present invention meets the latch-up prevention requirements for the RS-485 specification. Bi-SCR structure 100 can be formed to have a holding voltage of more than 12V in the positive ESD direction, and a holding voltage that is less than −7V in the negative ESD direction.

Figure 2A:
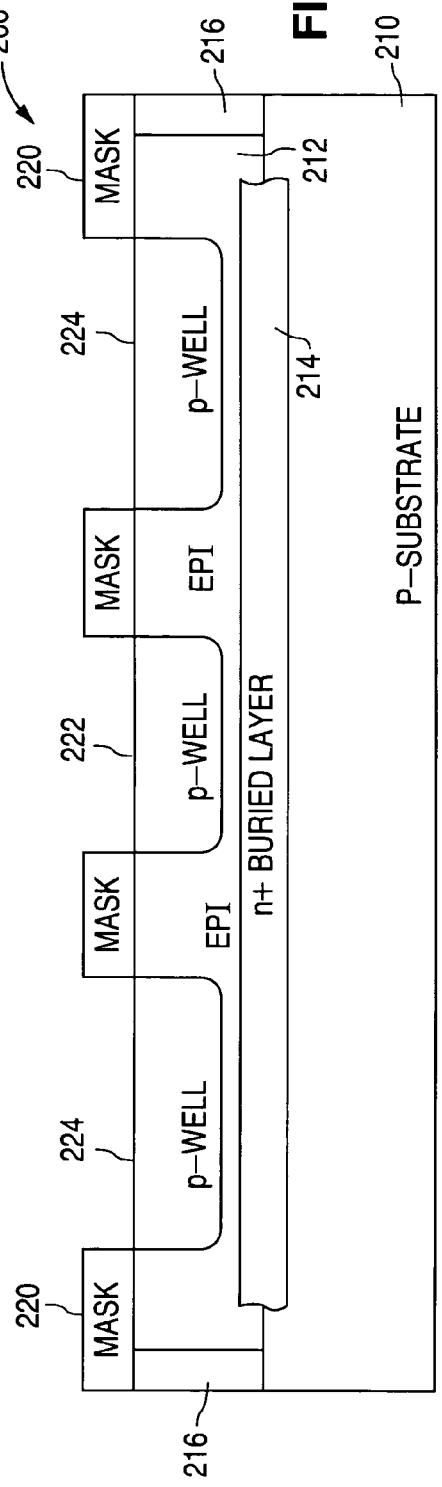

FIGS. 2A–2H show a series of cross-sectional diagrams that illustrate an example of a method of forming a bi-directional silicon controlled rectifier structure in accordance with the present invention. As shown in FIG. 2A, the method utilizes a wafer 200 that has been conventionally formed to have a p-type substrate 210, and an n-type epitaxial layer 212 that is formed on substrate 210.

In addition, wafer 200 has been conventionally formed to have an n+ buried layer 214 that is formed in the top surface of substrate 210 and the bottom region of epitaxial layer 214 (although this is optional), and vertical isolation regions 216 that are formed in epitaxial layer 212 to isolate laterally adjacent regions.

As shown in FIG. 2A, the method begins by forming and patterning a p-well implant mask 220 over epitaxial layer 212. After this, the regions of epitaxial layer 212 that are exposed by mask 220 are implanted to form a p-type center well 222 and a p-type circular well 224 that surrounds and is spaced apart from p-type center well 222. Mask 220 is then removed.

Figure 2B:
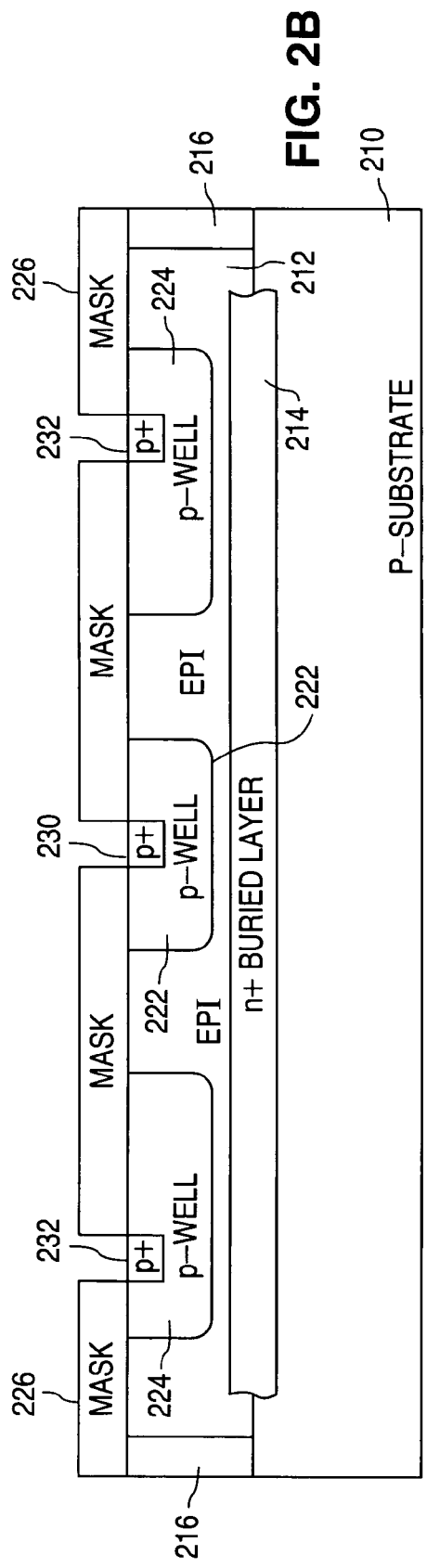

Next, as shown in FIG. 2B, after mask 220 has been removed, a p+ implant mask 226 is formed and patterned over epitaxial layer 212. After this, the regions of epitaxial layer 212 that are exposed by mask 226 are implanted to form a p+ center region 230 in the center of p-type center well 222, and a p+ outside ring 232 in p-type circular well 224. Mask 226 is then removed.

Figure 2C:
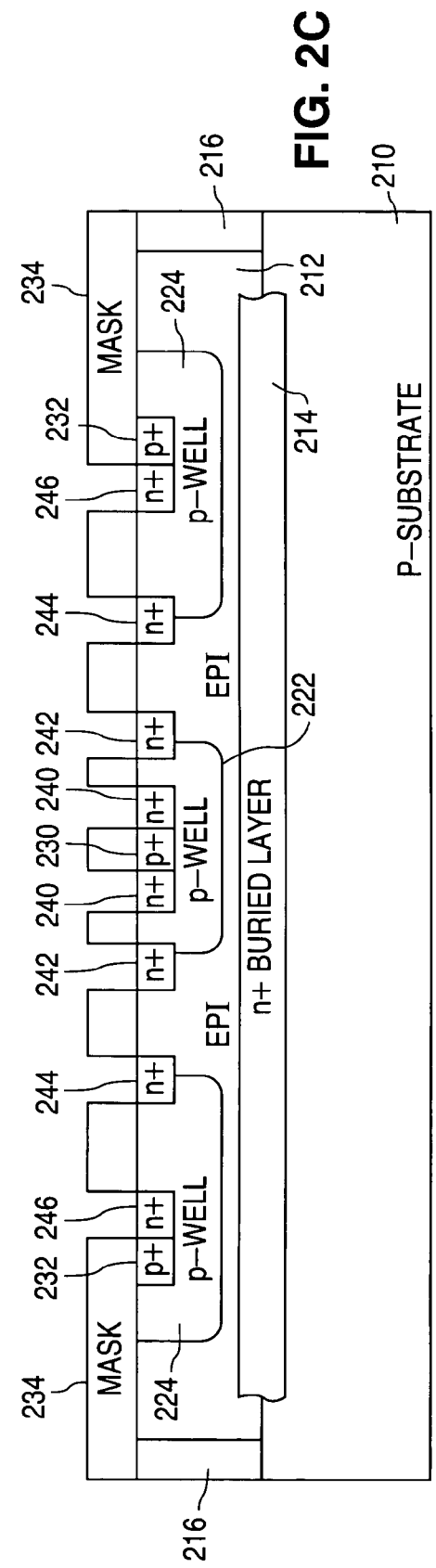

After this, as shown in FIG. 2C, once mask 226 has been removed, an n-type implant mask 234 is formed and patterned on epitaxial layer 212. Following this, the regions of eptaxial layer 212 that are exposed by mask 234 are implanted to form an n+ circular ring 240 in center p-well 222 that adjoins the outside edge of center region 230, and an n+ inner ring 242 in the top surface of epitaxial layer 212 at the junction between epitaxial layer 212 and center p-well 222.

In addition, the implant further forms an n+ outer ring 244 in the top surface of epitaxial layer 212 at the junction between epitaxial layer 212 and circular p-well 224, and an n+ inside ring 246 in p-type circular well 224 that adjoins the inside edge of p+ outside ring 232. Following the implant, mask 234 is removed.

Figure 2D:
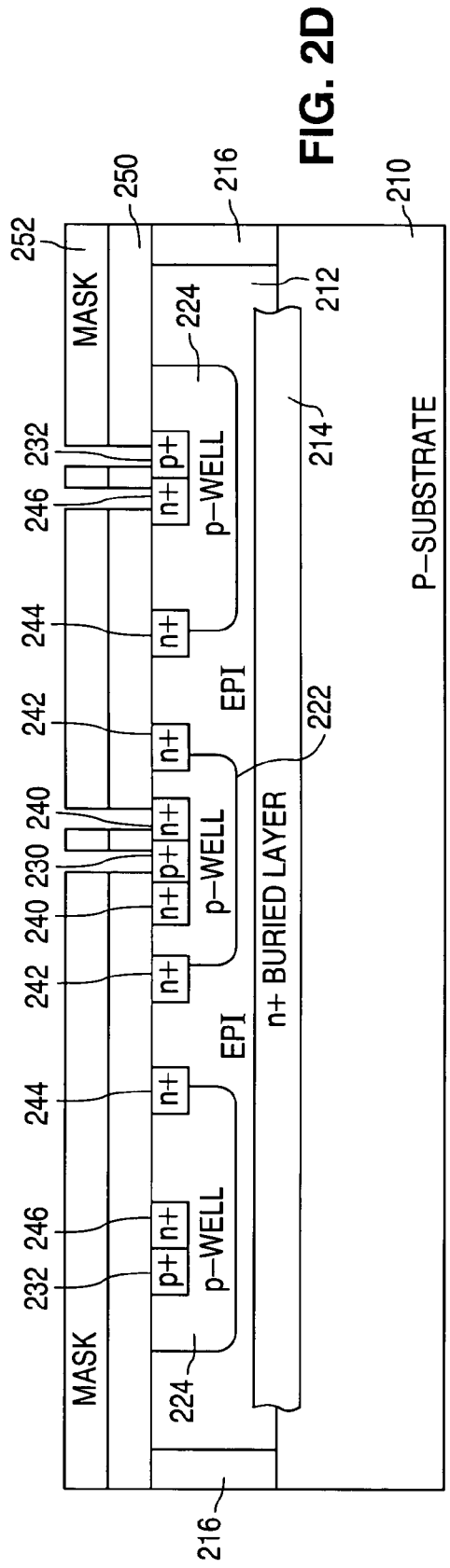

After this, as shown in FIG. 2D, an oxide dielectric layer 250 is formed over the top surface of epitaxial layer 212, followed by the formation and patterning of an oxide mask 252. (Layers of sacrificial oxide can also be used with the above described masking and implanting steps.)

The exposed areas of oxide dielectric layer 250 are then etched to form openings until the top surface of epitaxial layer 212 is exposed over p+ center region 230, n+ circular ring 240, n+ inside ring 246, and p+ outside ring 232. Oxide mask 252 is then removed. Although the present example shows mask 252 patterned to provide only a single opening to n+ inside ring 246 and a single opening to p+ outside ring 232 for simplicity, a number of openings can be formed to expose rings 232 and 246, or continuous ring openings can be formed to expose rings 232 and 246. (Additional openings can also be formed to expose ring 240.)

Figure 2E:
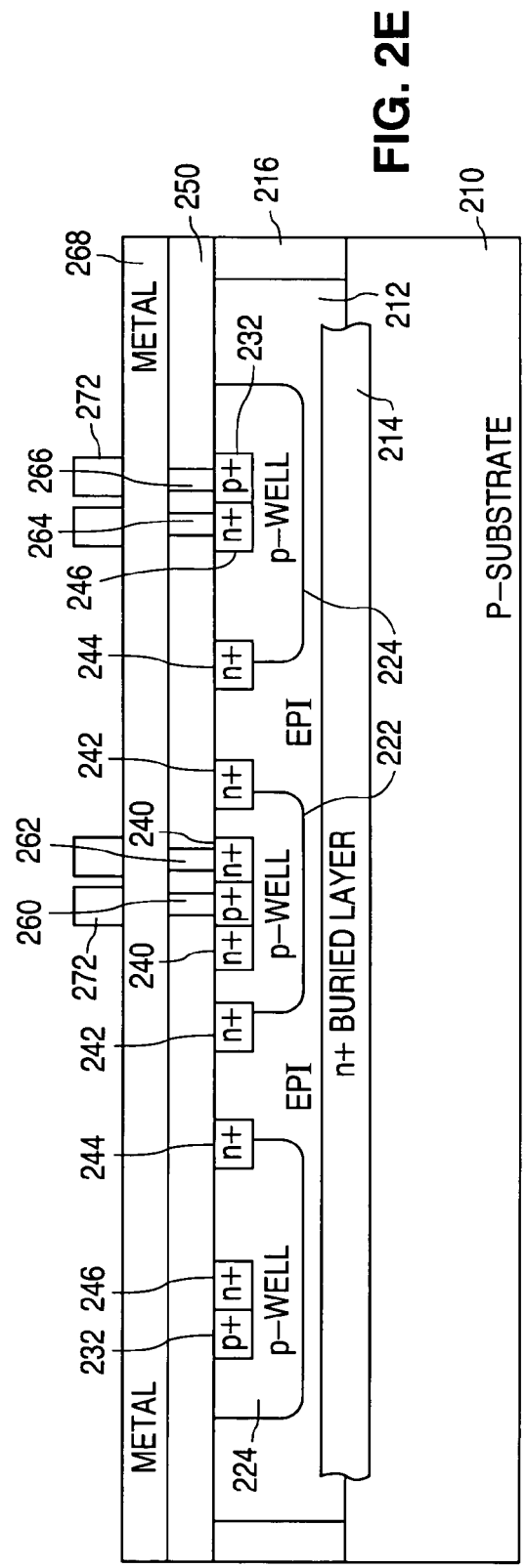

Next, a layer of metal, which can include a diffusion barrier layer and a metallic layer, is formed on epitaxial layer 212 and oxide dielectric layer 250 to fill up the openings. Following this, as shown in FIG. 2E, the metal layer is planarized to form contact structures 260, 262, 264, and 266. After this, a layer of metal 268 is formed on oxide dielectric layer 250 and contact structures 260, 262, 264, and 266. After metal layer 268 has been formed, a mask 272 is formed and patterned on metal layer 268.

As shown in FIG. 2F, after mask 272 has been formed, the regions of metal layer 268 that are exposed by mask 272 are etched until the top surface of oxide dielectric layer 250 is exposed to form metal areas 274, 276, 278, and 280 on contact structures 260, 262, 264, and 266. Mask 272 is then removed. Contact structure 260 and metal area 274 form metal-1 region 140, while contact structure 262 and metal area 276 form metal-1 region 142. In addition, contact structure 264 and metal area 278 form metal-1 region 144, while contact structure 266 and metal area 280 form metal-1 region 146.

Following this, as shown in FIG. 2G, an isolation layer 282 is formed on oxide dielectric layer 250 and metal areas 274, 276, 278, and 280. Next, a mask 284 is formed and patterned on isolation layer 282. The regions of isolation layer 282 that are exposed by mask 284 are then etched to form openings that expose the top surfaces of metal areas 274, 276, 278, and 280. Mask 284 is then removed.

Figure 2H:
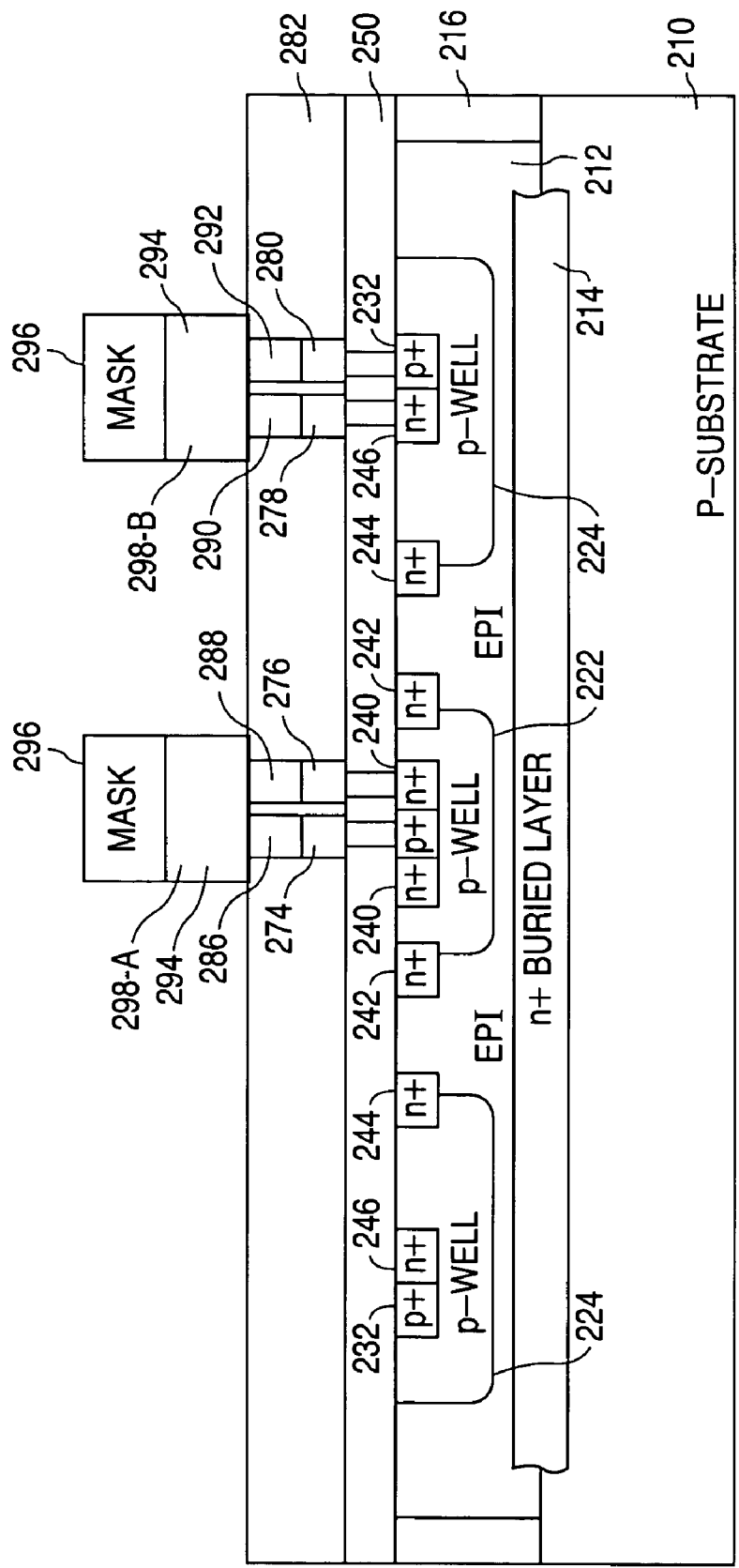

Once mask 284 has been removed, as shown in FIG. 2H, a layer of metal is formed on oxide layer 282 and metal areas 274, 276, 278, and 280 to fill up the openings. The layer of metal is then planarized to form metal structures 286, 288, 290, and 292 that make electrical connections with metal areas 274, 276, 278, and 280, respectively.

After this, a metal layer 294 is formed on oxide layer 282 and metal structures 286, 288, 290, and 292, followed by the formation and patterning of a mask 296. Once mask 296 has been formed, the exposed regions of metal layer 294 are etched to form a metal trace 298-A, such as metal trace 160, and a metal trace 298-B, such as metal trace 162. Mask 296 is then removed, and the process continues with the conventional steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A silicon controlled rectifier structure comprising:
   a semiconductor material of a first conductivity type having a top surface and a dopant concentration;
   a first well of a second conductivity type formed in the semiconductor material, the first well contacting the top surface of the semiconductor material and having a dopant concentration;
   a first semiconductor region of the first conductivity type formed in the first well, the first semiconductor region having a greater dopant concentration than the dopant concentration of the semiconductor material;
   a second semiconductor region of the second conductivity type formed in the first well, the second semiconductor region having a greater dopant concentration than the dopant concentration of the first well;
   a third semiconductor region of the first conductivity type formed in the semiconductor material, the third semiconductor region contacting the first well and the semiconductor material, being spaced apart from the first and second semiconductor regions, and having a greater dopant concentration than the dopant concentration of the semiconductor material;
   a second well of the second conductivity type formed in the semiconductor material, the second well contacting the top surface of the semiconductor material, and being spaced apart from the first well;
   a fourth semiconductor region of the first conductivity type formed in the semiconductor material, the fourth semiconductor region contacting the top surface of the semiconductor material, the second well, and the semiconductor material, and having a greater dopant concentration than the dopant concentration of the semiconductor material; and a fifth semiconductor region of the first conductivity type formed in the second well, the fifth semiconductor region contacting the top surface of the semiconductor material, being spaced apart from the fourth semiconductor region, and having a greater dopant concentration than the dopant concentration of the semiconductor material, a shortest distance between the second and third semiconductor regions being less than a shortest distance between the fourth and fifth semiconductor regions.

2. The silicon controlled rectifier structure of claim 1 and further comprising a sixth semiconductor region of the second conductivity type formed in the second well, the sixth semiconductor region contacting the top surface of the semiconductor material, being spaced apart from the fourth semiconductor region, and having a greater dopant concentration than the dopant concentration of the second well.

3. The silicon controlled rectifier structure of claim 2 wherein:
the fifth semiconductor region is spaced apart from a junction between the second well and the semiconductor material; and
the sixth semiconductor region is spaced apart from the junction between the second well and the semiconductor material.

4. The silicon controlled rectifier structure of claim 1 wherein the first and second semiconductor regions are electrically connected together.

5. The silicon controlled rectifier structure of claim 4 wherein the fifth and sixth semiconductor regions are electrically connected together.

6. A silicon controlled rectifier structure comprising:
a semiconductor material of a first conductivity type having a top surface and a dopant concentration;
a first well of a second conductivity type formed in the semiconductor material, the first well contacting the top surface of the semiconductor material and having a dopant concentration;
a first semiconductor region of the first conductivity type formed in the first well, the first semiconductor region having a greater dopant concentration than the dopant concentration of the semiconductor material;
a second semiconductor region of the second conductivity type formed in the first well, the second semiconductor region having a greater dopant concentration than the dopant concentration of the first well;
a third semiconductor region of the first conductivity type formed in the semiconductor material, the third semiconductor region contacting the first well and the semiconductor material, being spaced apart from the first and second semiconductor regions, and having a greater dopant concentration than the dopant concentration of the semiconductor material;
a second well of the second conductivity type formed in the semiconductor material, the second well contacting the top surface of the semiconductor material, and being spaced apart from the first well;
a fourth semiconductor region of the first conductivity type formed in the semiconductor material, the fourth semiconductor region contacting the top surface of the semiconductor material, the second well, and the semiconductor material, and having a greater dopant concentration than the dopant concentration of the semiconductor material, the second well surrounding the first well.

7. The silicon controlled rectifier structure of claim 6 wherein the second semiconductor region surrounds the first semiconductor region.

8. The silicon controlled rectifier structure of claim 7 wherein the third semiconductor region surrounds the second semiconductor region.

9. The silicon controlled rectifier structure of claim 8 wherein the fourth semiconductor region surrounds the third semiconductor region.

10. The silicon controlled rectifier structure of claim 9 wherein the fifth semiconductor region surrounds the fourth semiconductor region.

11. A silicon controlled rectifier structure comprising:
a semiconductor material of a first conductivity type having a top surface and a dopant concentration;
a first well of a second conductivity type formed in the semiconductor material, the first well contacting the top surface of the semiconductor material and having a dopant concentration;
a first semiconductor region of the first conductivity type formed in the first well, the first semiconductor region having a greater dopant concentration than the dopant concentration of the semiconductor material;
a second semiconductor region of the second conductivity type formed in the first well, the second semiconductor region having a greater dopant concentration than the dopant concentration of the first well;
a third semiconductor region of the first conductivity type formed in the semiconductor material, the third semiconductor region contacting the first well and the semiconductor material, being spaced apart from the first and second semiconductor regions, and having a greater dopant concentration than the dopant concentration of the semiconductor material;
a second well of the second conductivity type formed in the semiconductor material, the second well contacting the top surface of the semiconductor material, and being spaced apart from the first well;
a fourth semiconductor region of the first conductivity type formed in the semiconductor material, the fourth semiconductor region contacting the top surface of the semiconductor material, the second well, and the semiconductor material, and having a greater dopant concentration than the dopant concentration of the semiconductor material; and
a fifth semiconductor region of the first conductivity type formed in the second well, the fifth semiconductor region contacting the top surface of the semiconductor material, being spaced apart from the fourth semiconductor region, and having a greater dopant concentration than the dopant concentration of the semiconductor material, a lateral spacing between the fourth and fifth semiconductor regions being adjusted to set a holding voltage.

12. A method of forming a silicon controlled rectifier structure, the rectifier structure having a semiconductor material of a first conductivity type, the semiconductor material having a top surface, the method comprising the steps of:
forming a first well and a second well of a second conductivity type in the semiconductor material;
forming a plurality of regions of the first conductivity type in the top surface of the semiconductor material so that a first semiconductor region lies in the first well and a second semiconductor region lies in the second well; and forming a plurality of regions of the second conductivity type in the top surface of the semiconductor material so that a third semiconductor region lies in the first well, a fourth semiconductor region lies in the second well, and a fifth semiconductor region that contacts the first well and the semiconductor material, and is spaced apart from the first and the third semiconductor regions, a shortest distance between the second and third semiconductor regions is less than a shortest distance between the fourth and fifth semiconductor regions.

13. A silicon controlled rectifier structure comprising:
a semiconductor material of a first conductivity type having a top surface and a dopant concentration;
a first well of a second conductivity type formed in the semiconductor material, the first well contacting the top surface of the semiconductor material and having a dopant concentration;
a first semiconductor region of the second conductivity type formed in the first well, the first semiconductor region having a greater dopant concentration than the dopant concentration of the first well;
a second semiconductor region of the first conductivity type formed in the first well, the second semiconductor region having a greater dopant concentration than the dopant concentration of the semiconductor material, the second semiconductor region contacting and surrounding the first semiconductor region; and
a third semiconductor region of the first conductivity type formed in the semiconductor material, the third semiconductor region contacting the first well and the semiconductor material, being spaced apart from the first and second semiconductor regions, and having a greater dopant concentration than the dopant concentration of the semiconductor material.

14. The silicon controlled rectifier structure of claim 13 wherein the third semiconductor region surrounds the second semiconductor region.

15. A silicon controlled rectifier structure comprising:
a semiconductor material of a first conductivity type having a top surface and a dopant concentration;
a first well of a second conductivity type formed in the semiconductor material, the first well contacting the top surface of the semiconductor material and having a dopant concentration;
a first semiconductor region of the second conductivity type formed in the first well, the first semiconductor region having a greater dopant concentration than the dopant concentration of the first well;
a second semiconductor region of the first conductivity type formed in the first well, the second semiconductor region having a greater dopant concentration than the dopant concentration of the semiconductor material, the second semiconductor region contacting and surrounding the first semiconductor region; and
a second well of the second conductivity type formed in the semiconductor material, the second well surrounding the first well, contacting the top surface of the semiconductor material, and being spaced apart from the first well.

16. The silicon controlled rectifier structure of claim 15 and further comprising a semiconductor area that lies below the first and second wells, the semiconductor area having the first conductivity type and a dopant concentration that is greater than the dopant concentration of the semiconductor material.

17. A silicon controlled rectifier structure comprising:
a semiconductor material of a first conductivity type having a top surface and a dopant concentration;
a first well of a second conductivity type formed in the semiconductor material, the first well contacting the top surface of the semiconductor material and having a dopant concentration;
a first semiconductor region of the second conductivity type formed in the first well, the first semiconductor region having a greater dopant concentration than the dopant concentration of the first well;
a second semiconductor region of the first conductivity type formed in the first well, the second semiconductor region having a greater dopant concentration than the dopant concentration of the semiconductor material, the second semiconductor region contacting and surrounding the first semiconductor region;
a third semiconductor region of the first conductivity type formed in the semiconductor material, the third semiconductor region contacting the first well and the semiconductor material, being spaced apart from the first and second semiconductor regions, and having a greater dopant concentration than the dopant concentration of the semiconductor material;
a second well of the second conductivity type formed in the semiconductor material, the second well contacting the top surface of the semiconductor material, and being spaced apart from the first well; and
a fourth semiconductor region of the first conductivity type formed in the semiconductor material, the fourth semiconductor region contacting the top surface of the semiconductor material, the second well, and the semiconductor material, and having a greater dopant concentration than the dopant concentration of the semiconductor material.

18. The silicon controlled rectifier structure of claim 17 wherein the fourth semiconductor region surrounds the first well.

19. The silicon controlled rectifier structure of claim 18 and further comprising:
a fifth semiconductor region of the first conductivity type formed in the second well, the fifth semiconductor region contacting the top surface of the semiconductor material, being spaced apart from the fourth semiconductor region, and having a greater dopant concentration than the dopant concentration of the semiconductor material; and
a sixth semiconductor region of the second conductivity type formed in the second well, the sixth semiconductor region contacting the top surface of the semiconductor material, being spaced apart from the fourth semiconductor region, contacting the fifth semiconductor region, and having a greater dopant concentration than the dopant concentration of the second well.

* * * * *